(12) United States Patent
Robarge et al.

(10) Patent No.: US 7,719,257 B2
(45) Date of Patent: May 18, 2010

(54) CURRENT SENSING MODULE AND ASSEMBLY METHOD THEREOF

(75) Inventors: Dean Arthur Robarge, Southington, CT (US); Robert Joseph Caggiano, Wolcott, CT (US); Cecil Rivers, Jr., Hartford, CT (US); Roossely Delica, Jamaica Plain, MA (US)

(73) Assignee: General Electric Company, Schenectady, NY (US)

( * ) Notice: Subject to any disclaimer, the term of this patent is extended or adjusted under 35 U.S.C. 154(b) by 189 days.

(21) Appl. No.: 11/759,307

(22) Filed: Jun. 7, 2007

(65) Prior Publication Data

US 2008/0079437 A1 Apr. 3, 2008

Related U.S. Application Data

(63) Continuation-in-part of application No. 11/536,377, filed on Sep. 28, 2006, now Pat. No. 7,493,221.

(51) Int. Cl.
*G01R 15/20* (2006.01)
*G01R 29/12* (2006.01)

(52) U.S. Cl. .................................. 324/117 R; 324/109

(58) Field of Classification Search ................ 324/107, 324/109, 117 R, 117 H, 127
See application file for complete search history.

(56) References Cited

U.S. PATENT DOCUMENTS

| | | | |
|---|---|---|---|
| 3,496,409 A | 2/1970 | Connell | 315/36 |
| 4,384,289 A | 5/1983 | Stillwell et al. | |
| 4,723,187 A | 2/1988 | Howell | |
| 4,827,272 A | 5/1989 | Davis | |
| 4,847,780 A | 7/1989 | Gilker et al. | |
| 4,855,671 A * | 8/1989 | Fernandes | 324/127 |
| 5,374,792 A | 12/1994 | Ghezzo et al. | |
| 5,426,360 A | 6/1995 | Maraio et al. | |
| 5,430,597 A | 7/1995 | Bagepalli et al. | 361/93 |
| 5,454,904 A | 10/1995 | Ghezzo et al. | |
| 5,502,374 A | 3/1996 | Cota | |
| 5,825,175 A * | 10/1998 | Selcuk | 324/117 H |
| 5,889,643 A | 3/1999 | Elms | |
| 5,940,260 A | 8/1999 | Gelbien et al. | |
| 5,943,223 A | 8/1999 | Pond | |
| 5,973,896 A | 10/1999 | Hirsh et al. | |

(Continued)

FOREIGN PATENT DOCUMENTS

DE 19850397 A1 5/2000

(Continued)

OTHER PUBLICATIONS

"Power Circuit Breaker Using Micro-Mechanical Switches"; Authors: George G. Karady and Gerald Thomas Heydt; Int J. Critical Infrastructure, vol. 3, Nos. 1/2, 2007; pp. 88-100; XP008087882.

(Continued)

*Primary Examiner*—Ernest F Karlsen
(74) *Attorney, Agent, or Firm*—Cantor Colburn LLP

(57) ABSTRACT

A current sensing module for disposal proximate a conductor is disclosed. The current sensing module includes a housing having a first section and a second section that together define an opening for receiving the conductor therethrough. The second section is in operable connection with the first section. The current sensing module further includes a micro-electro-mechanical system (MEMS) based current sensor disposed within the first section proximate the opening for receiving the conductor.

18 Claims, 8 Drawing Sheets

U.S. PATENT DOCUMENTS

| | | | |
|---|---|---|---|
| 6,054,659 | A | 4/2000 | Lee et al. |
| 6,188,322 | B1* | 2/2001 | Yao et al. ............... 340/664 |
| 6,275,366 | B1 | 8/2001 | Gelbien et al. |
| 6,291,986 | B1* | 9/2001 | Sorensen ............... 324/156 |
| 6,563,683 | B1 | 5/2003 | Strumpler ............... 361/93.1 |
| 6,642,704 | B2* | 11/2003 | Hastings et al. ......... 324/117 H |
| 6,738,246 | B1 | 5/2004 | Strumpler ............... 361/93.1 |
| 6,904,471 | B2 | 6/2005 | Boggs et al. ............... 710/8 |
| 2001/0014949 | A1 | 8/2001 | Leblanc |
| 2002/0008149 | A1 | 1/2002 | Riley et al. |
| 2002/0145841 | A1 | 10/2002 | Williams et al. |
| 2003/0050737 | A1 | 3/2003 | Osann, Jr. |
| 2003/0212473 | A1 | 11/2003 | Vandevanter |
| 2004/0032320 | A1 | 2/2004 | Zalitzky et al. |
| 2004/0113713 | A1 | 6/2004 | Zipper et al. |
| 2004/0263125 | A1 | 12/2004 | Kanno et al. |
| 2005/0085928 | A1 | 4/2005 | Shani ............... 700/18 |
| 2005/0248340 | A1 | 11/2005 | Berkcan et al. |
| 2005/0270014 | A1 | 12/2005 | Zribi et al. |
| 2006/0121785 | A1 | 6/2006 | Caggiano et al. |
| 2006/0187688 | A1 | 8/2006 | Tsuruya ............... 363/56.12 |
| 2006/0202933 | A1 | 9/2006 | Pasch et al. ............... 345/94 |
| 2007/0013357 | A1 | 1/2007 | Huang et al. ............... 323/318 |
| 2007/0057746 | A1 | 3/2007 | Rubel |
| 2007/0142938 | A1 | 6/2007 | Huang ............... 700/40 |
| 2007/0173960 | A1 | 7/2007 | Kumar ............... 700/40 |

FOREIGN PATENT DOCUMENTS

| | | |
|---|---|---|
| DE | 19927762 A1 | 1/2001 |
| EP | 0072422 A1 | 2/1983 |
| EP | 0233756 A1 | 8/1987 |
| EP | 0774822 A1 | 5/1997 |
| EP | 1255268 A1 | 11/2002 |
| EP | 1610142 A1 | 12/2005 |
| EP | 1643324 A2 | 4/2006 |
| EP | 1681694 A1 | 7/2006 |
| GB | 2123627 A | 2/1984 |
| WO | 9946606 A2 | 9/1999 |
| WO | 0004392 A1 | 1/2000 |
| WO | 2006078944 A2 | 7/2006 |
| WO | 2006100192 A1 | 9/2006 |

OTHER PUBLICATIONS

"MEMS Based Electronic Circuit Breaker as a Possible Component for and Electrical Ship", Authors: George G. Karady and Gerald T. Heydt; IEEE Electric Ship Technologies Symposium, 2005; pp. 214-218; XP-002468154.

"Advanced MEMS for High Power Integrated Distribution Systems"; Authors: Rahim Kasim, Bruce C. Kim and Josef Drobnik; IEEE Computer; Proceedings of the International Conference on MEMS, NANO and Smart Systems, 2005; pp. 1-6.

PCT International Search Report; International Application No. PCT/US2007/014379; International Filing Date Jun. 20, 2007; Date of Mailing Feb. 11, 2008.

PCT International Search Report; International Application No. PCT/US2007/071644; International Filing Date Jun. 20, 2007; Date of Mailing Feb. 13, 2008.

PCT International Search Report; International Application No. PCT/US2007/071624; International Filing Date Jun. 20, 2007; Date of Mailing Feb. 18, 2008.

PCT International Search Report; International Application No. PCT/US2007/071627; International Filing Date Jun. 20, 2007; Date of Mailing Feb. 29, 2008.

PCT International Search Report; International Application No. PCT/US2007/071630; International Filing Date Jun. 20, 2007; Date of Mailing Mar. 7, 2008.

PCT Written Opinion of the International Searching Authority; International Application No. PCT/US2007/071630; International Filing Date Jun. 20, 2007; Date of Mailing Mar. 7, 2008.

PCT International Search Report; International Application No. PCT/US2007/071632; International Filing Date Jun. 20, 2007; Date of Mailing Feb. 29, 2008.

PCT Written Opinion of the International Searching Authority; International Application No. PCT/US2007/071632; International Filing Date Jun. 20, 2007; Date of Mailing Feb. 29, 2008.

PCT International Search Report; International Application No. PCT/US2007/014363; International Filing Date Jun. 20, 2007; Date of Mailing Mar. 4, 2008.

PCT International Search Report; International Application No. PCT/US2007/071656; International Filing Date Jun. 20, 2007; Date of Mailing Mar. 12, 2008.

PCT International Search Report; International Application No. PCT/US2007/071654; International Filing Date Jun. 20, 2007; Date of Mailing Mar. 13, 2008.

PCT International Search Report; International Application No. PCT/US2007/014362; International Filing Date Jun. 20, 2007; Date of Mailing Mar. 20, 2008.

PCT International Search Report; International Application No. PCT/US2007/071643; International Filing Date Jun. 20, 2007; Date of Mailing Feb. 8, 2008.

PCT Written Opinion of the International Searching Authority; International Application No. PCT/US2007/071643; International Filing Date Jun. 20, 2007; Date of Mailing Feb. 8, 2008.

George G. Karady and G.T. Heydt, "Novel Concept for Medium Voltage Circuit Breakers Using Microswitches," IEEE Transactions on Power Delivery, vol. 21, No. 1, Jan. 2006.

USPTO Office Action dated Oct. 17, 2008; Filing Date: Jun. 19, 2007; First Named Inventor: William James Premerlani; Confirmation No. 6421.

USPTO Office Action dated Oct. 24, 2008; Filing Date: Jun. 15, 2007; First Named Inventor: William James Permerlani; Confirmation No. 4167.

USPTO Office Action dated Oct. 28, 2008; Filing Date: Jun. 8, 2007; First Named Inventor: Cecil Rivers, Jr.; Confirmation No. 7895.

European Search Report for European Application No. 07110554.8; European Filing Date of Oct. 19, 2007, Mailing Date of Oct. 30, 2007; (6 pgs).

* cited by examiner

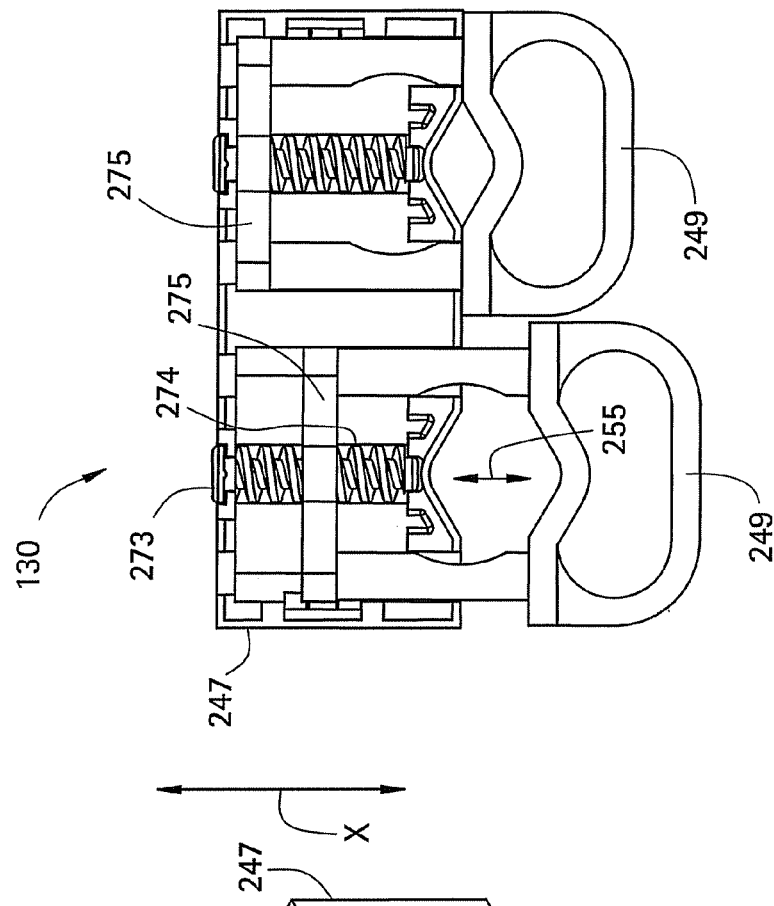
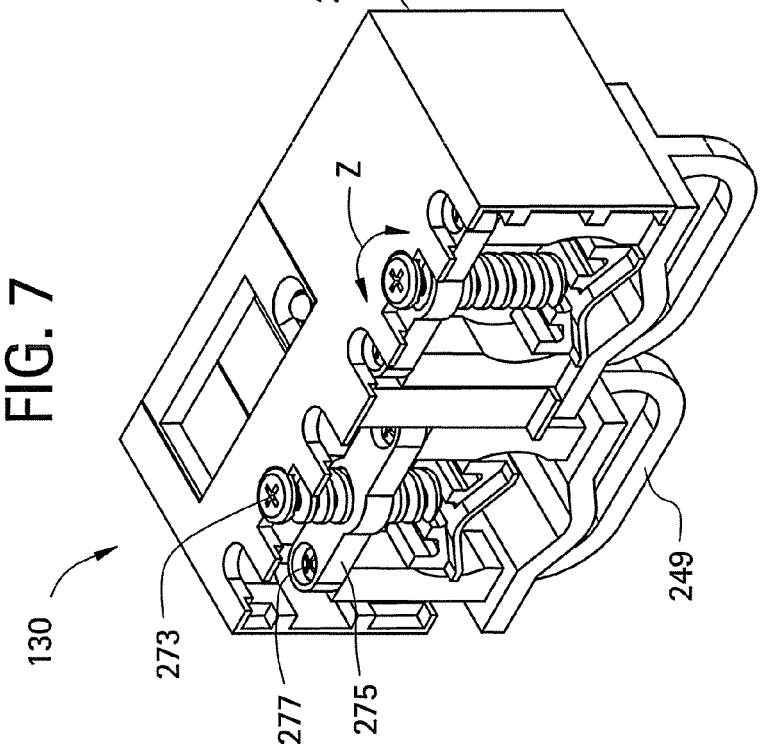

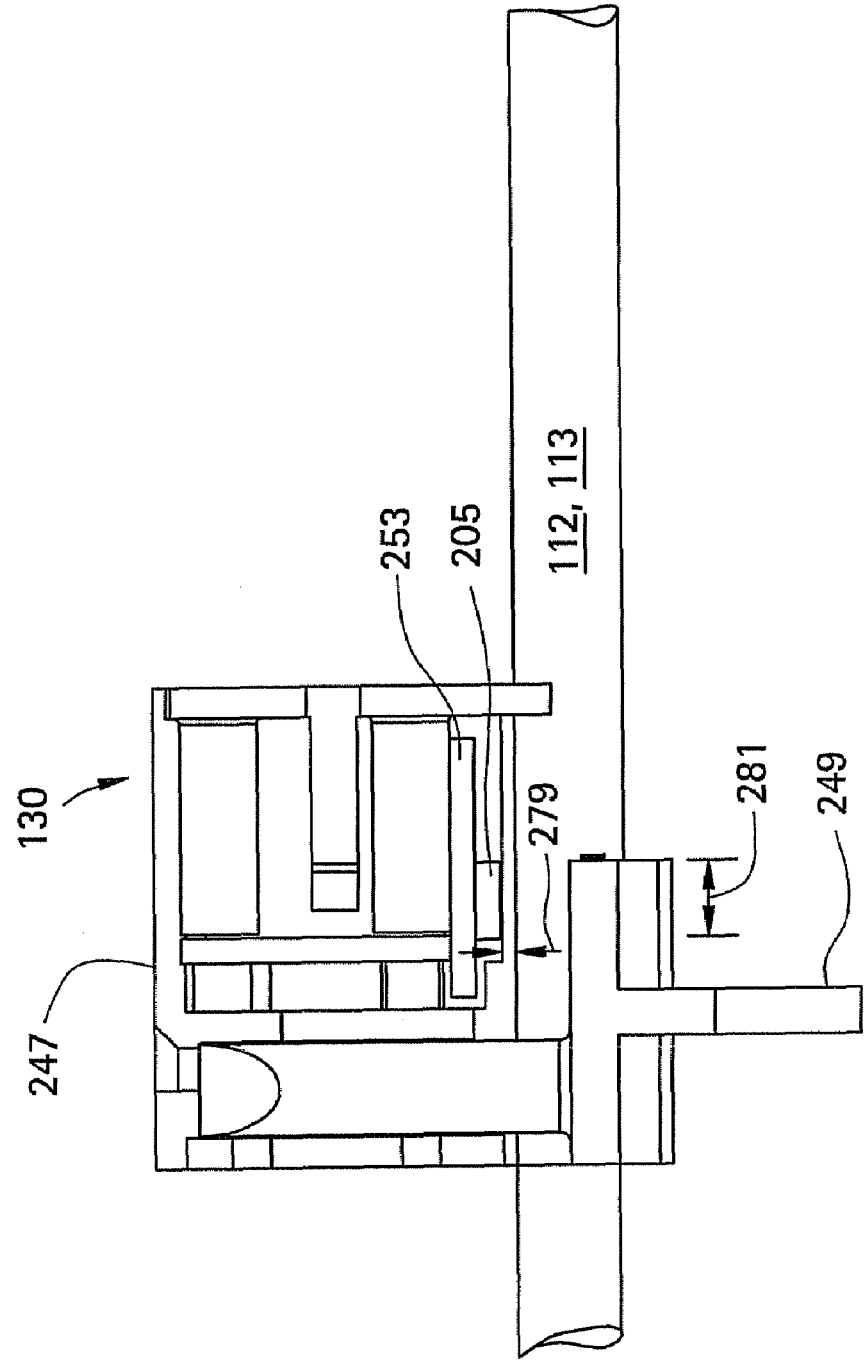

CURRENT SENSING MODULE AND ASSEMBLY METHOD THEREOF

CROSS REFERENCE TO RELATED APPLICATIONS

This application is a continuation-in-part application of U.S. patent application Ser. No. 11/536,377, filed Sep. 28, 2006, the contents of which are incorporated by reference herein in their entirety.

BACKGROUND OF THE INVENTION

The present disclosure relates generally to electrical power distribution, and particularly to measurement of power for at least one of a plurality of circuits. A building owner of a multi-tenant building, where deregulation has taken effect, can often purchase power from a utility provider in bulk at a wholesale rate, and re-sell it to the tenants. A sub-metering panel allows the building owner to accurately measure & bill the tenants for the power consumed by each tenant.

Sub-metering is traditionally performed by installing a current transformer (CT) on the conductor that is carrying the electrical load. There is one CT per phase of any load that is to be monitored, and each CT has two wire leads that carry the signal from the CT to the meter. These CTs are space consuming and difficult to mount. They take up wire bend space within an electrical distribution enclosure, as defined by Underwriters Laboratories (UL), and are obstructions to wires and cables in the equipment gutters and wire ways. The installation of these CTs and the extensive internal wiring is a cumbersome, time-consuming process and therefore increases the expense associated with the installation process. Another method of sub-metering is also known as modular metering. Modular metering involves installing a modular meter for each suite. This method is space consuming, as it requires a meter for each circuit to be monitored. Yet another method of sub-metering is also known as master metering. In this method of sub-metering, a building owner divides the total annual utility bill of the building by a predetermined factor, such as square footage, and number of tenants per suite, for example, and charges the suite's tenant a fraction of the total utility bill according to the predetermined factor. This method is highly inaccurate. Accordingly, there is a need in the art for a sub-metering arrangement that overcomes these drawbacks.

BRIEF DESCRIPTION OF THE INVENTION

An embodiment of the invention includes a current sensing module for disposal proximate a conductor. The current sensing module includes a housing having a first section and a second section that together define an opening for receiving the conductor therethrough. The second section is in operable connection with the first section. The current sensing module further includes a micro-electromechanical system (MEMS) based current sensor disposed within the first section proximate the opening for receiving the conductor.

Another embodiment of the invention includes a method of disposing a current sensing module proximate a conductor. The method includes disposing a first section of a housing proximate the conductor, the first section comprising a micro-electromechanical system (MEMS)-based current sensor. The method further includes connecting a second section of the housing with the first section, thereby defining an opening for receiving the conductor therethrough.

BRIEF DESCRIPTION OF THE DRAWINGS

Referring to the exemplary drawings wherein like elements are numbered alike in the accompanying Figures:

FIGS. 7 and 8 depict cut away views of a current sensing module in accordance with an embodiment of the invention;

FIG. 9 depicts a cut away view of a current sensing module clamped upon a conductor in accordance with an embodiment of the invention;

DETAILED DESCRIPTION OF THE INVENTION

An embodiment of the invention will provide a compact sub-metering panel that will accurately track and store the power consumption of each suite, or apartment, in a multi-tenant building. Measurements of voltage and current of each suite will be used to calculate the power consumed by the suite. In an embodiment, the compact sub-metering panel will measure the current using a MEMS-based current sensor proximate to a conductor of each sub-metered breaker, and transmit the measurement to a panel-centralized hub. In an embodiment, one of the hub, and a module including the current sensor will measure the voltage, calculate the energy and power consumed by each breaker, and output the energy and power consumption calculations to a central data collector. In an embodiment, the data collector will calculate a bill, based on the energy and power consumed by the particular suite. In an embodiment, the transmission from the hub to data collector can be one of a wired connection and a wireless connection.

Figure 1:
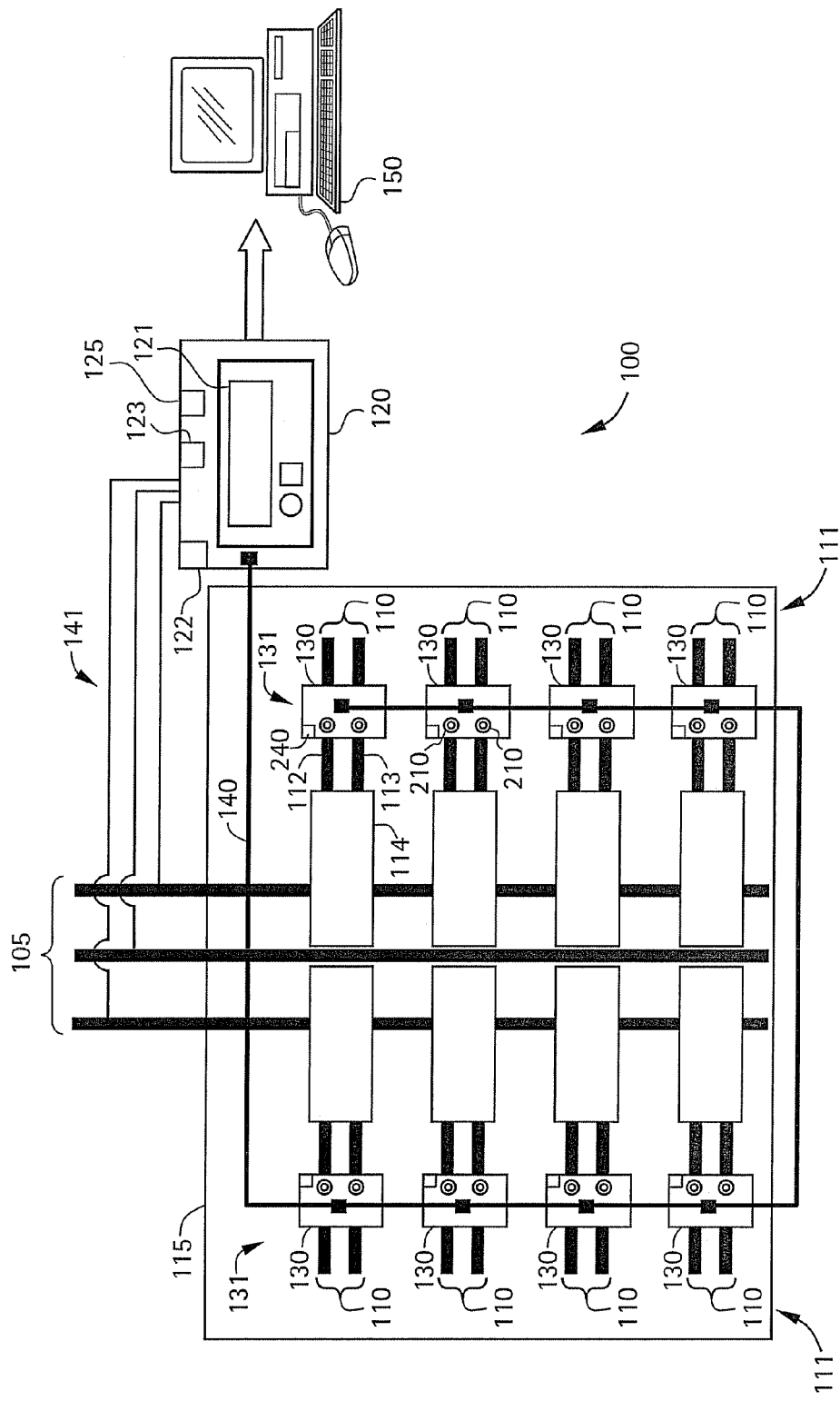
FIG. 1 depicts a schematic block diagram of an electrical sub-metering system in accordance with an embodiment of the invention.

Referring now to FIG. 1, an electrical sub-metering system 100 is depicted. In an embodiment, the sub-metering system 100 comprises an electrical panel board (also herein referred to as a panel) 115, a plurality 111 of circuits 110, a plurality 131 of current sensing modules (CSMs) (also herein referred to as modules) 130, a hub 120, and a data collector 150. In an embodiment, each CSM 130 of the plurality 131 of CSMs 130 is associated with a respective one circuit 110 of the plurality 111 of circuits.

In an embodiment, the electrical sub-metering system 100 is configured to make available to a user a power consumption calculation of at least one circuit 110 of the plurality 111 of circuits. As used herein, the term user shall refer to any person or group of persons such as a tenant, a property manager, a property management association, a utility company, and a corporate consumer of power, for example, that may be interested to be aware of the specific amount of power consumed by the specific circuit 110. In an embodiment, the amount of power consumed by the specific circuit 110, or a group of specific circuits 110, may represent the amount of power that has been consumed, such as by a specific tenant, or a specific department within a corporate setting. As used herein, the term suite shall refer to an apartment within an multi-tenant building, an office within an office building, a department within a facility, or any other sub-group of circuits that may be desired to be segregated from the entire group for the purposes of measurement and tracking of power consumption.

In an embodiment, the electrical panel board 115 is configured to distribute power from a common source, or feed 105 to the plurality 111 of circuits 110, each circuit 110 capable of identification as representing a unique point of power consumption, as described above. In an embodiment, the CSM 130 is configured to measure, or monitor, the current flow through each circuit 110 of the plurality 111 of circuits. It will be appreciated that while an embodiment of the invention has been depicted having the CSM 130 in connection with all circuits 110 of the plurality 111 of circuits 110, that the scope of the invention will not be so limited, and that the invention will also apply to sub-metering systems 100 that may have the CSM 130 in connection with any portion of the plurality 111 of circuits 110.

In an embodiment, the hub 120 is in signal communication with the plurality 131 of CSMs 130 via a single communication link 140, and the electrical panel board 115 via feed 105 connections 141. The hub 120 includes processing circuitry 125 for calculating, transforming, and communicating the information associated with the power consumption. In an embodiment, the hub 120 is configured to collect information associated with power consumption from the CSM 130 and the panel 115. In an embodiment, the data collector 150 is in signal communication with the hub 120, which is configured to collect and to make available to the user the power consumption calculation derived from the information associated with power consumption for each circuit 110 that is in connection with the CSM 130. In an embodiment, the hub 120 includes a voltage sensor 123 configured to measure the voltage of each circuit 110. It will be appreciated that the voltage sensor 123 may be one of many types known in the art, such as a resistive bridge network configured to measure voltage, for example.

While an embodiment of the invention has been described and depicted with one hub 120 in signal communication with the data collector 150, it will be appreciated that the scope of the invention is not so limited, and that the invention will also apply to electrical sub-metering systems 100 that may include alternate arrangements of the hub and the data collector, such as having more than one hub in signal communication with a single data collector, one hub in signal communication with more than one data collector, and more than one hub in signal communication with more than one data collector, for example. Further, while an embodiment has been depicted with one CSM in signal communication with the hub, it will be appreciated that the scope of the invention is not so limited, and that the invention will also apply to electrical sub-metering systems 100 that may have alternate arrangements of the CSM and the hub, such as more than one CSM in signal communication with one hub, for example.

In an embodiment, the CSM 130 includes a micro-electromechanical system (MEMS)-based current sensor, as described in commonly assigned U.S. Patent Application Publication No. 2005/0270014 entitled "Micro-Electromechanical System (MEMS) Based Current & Magnetic Field Sensor Having Capacitive Sense Components", and U.S. Patent Application Publication No. 2005/0248340 entitled "Microelectromechanical System Sensor and Method for Using", the contents of which are herein incorporated by reference in their entirety.

While an embodiment of the invention has been described having a current sensing module including a MEMS-based current sensor, it will be appreciated that the scope of the invention is not so limited, and that the invention will also apply to electrical sub-metering systems 100 using CSMs having alternate current sensors, such as hall-effect current sensors, for example.

Figure 2:
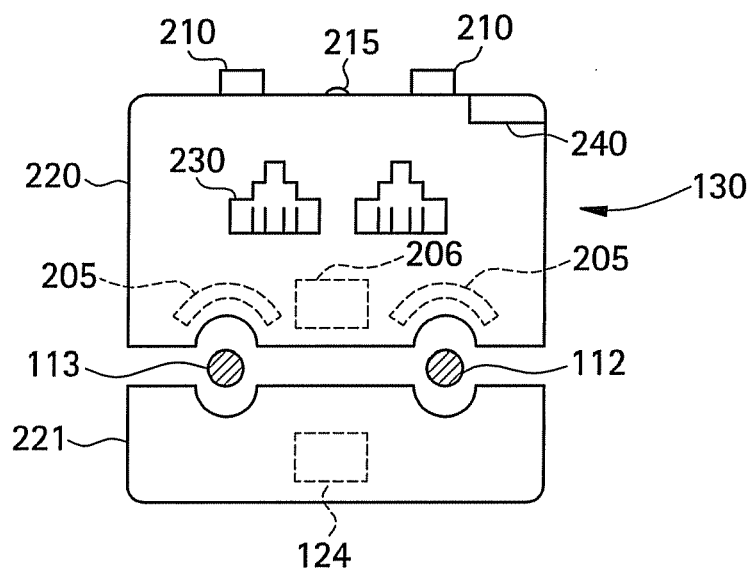
FIG. 2 depicts a schematic representation of an exemplary current sensing module in accordance with an embodiment of the invention.

With reference now to FIGS. 1 and 2, an exemplary embodiment of the CSM 130 is depicted. In an embodiment, a current protection device 114, such as at least one of a circuit breaker and a fusible switch, for example is in power connection with a conducting cable (also herein referred to as a conductor) 112, 113 of the circuit 110, and disposed within the panel 115. In the embodiment depicted in FIG. 2, current sensors 205 are depicted disposed within the CSM 130. In an embodiment, the CSM 130 includes the current sensors 205 and their appropriate interface electronics 206. In an embodiment, the interface electronics 206 of the CSM 130 are configured to amplify, sample, and process a sensed, or measured, current flow, and include communication circuitry to make available to the hub 120 a signal representative of the sensed current flow. In another embodiment, the interface electronics 206 are configured to be receptive of a signal representative of the circuit 110 voltage, to calculate the power consumed, and to make available, via the communication circuitry of the interface electronics 206, to the hub 120 the power consumption calculation. In an embodiment, the CSM 130 is a modular design having a two-piece housing 220, 221 to allow the current sensors 205 of the CSM 130 to be installed without the need to remove the conductor 112, 113 from the device 114, or any other connection made with the conductor 112, 113. In another embodiment, the MEMS-based current sensor 205 is disposed proximate a portion less than 100% of a circumference of the conductor 112, 113 of one of the plurality 111 of circuits 110, absent complete enclosure of the conductor 112, 113. In another embodiment, the MEMS-based current sensor 205 is disposed proximate the device 114. In an embodiment, the CSM 130 additionally includes a voltage sensor 124, such as a resistive bridge network configured to measure voltage, for example.

In an embodiment, the MEMS-based current sensor 205 is clipped onto the conductor 112, 113, allowing an installer a simple means to retrofit panels 115 that were not originally configured to provide sub-metering functionality. While the clip of the current sensor 205 may completely encircle or enclose the conductor 112, 113, as previously discussed, the actual MEMS-based current sensor 205 is disposed proximate a portion less than 100% of the circumference of the conductor 112, 113, absent complete enclosure of the conductor 112, 113. In an embodiment, the current sensor 205 is attached, or clipped, onto the conductor 112, 113 absent a split-core transformer, as may be used in other sub-metering applications. In an embodiment, the MEMS-based current sensor 205 provides current measurements having enhanced accuracy over split-core current transformers.

Figure 3:
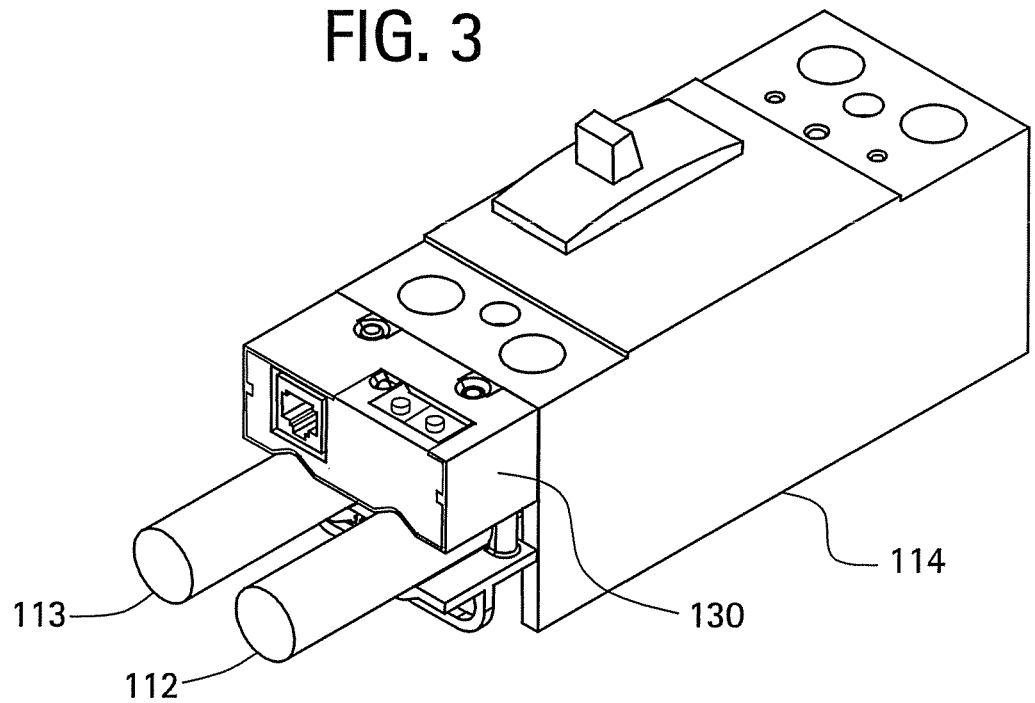
FIG. 3 depicts a top perspective view of a current sensing module disposed proximate a current protection device in accordance with an embodiment of the invention.

FIG. 3 depicts an exemplary embodiment of the CSM 130 disposed proximate the circuit breaker 114, via clamping onto the conductors 112, 113.

Figure 4:
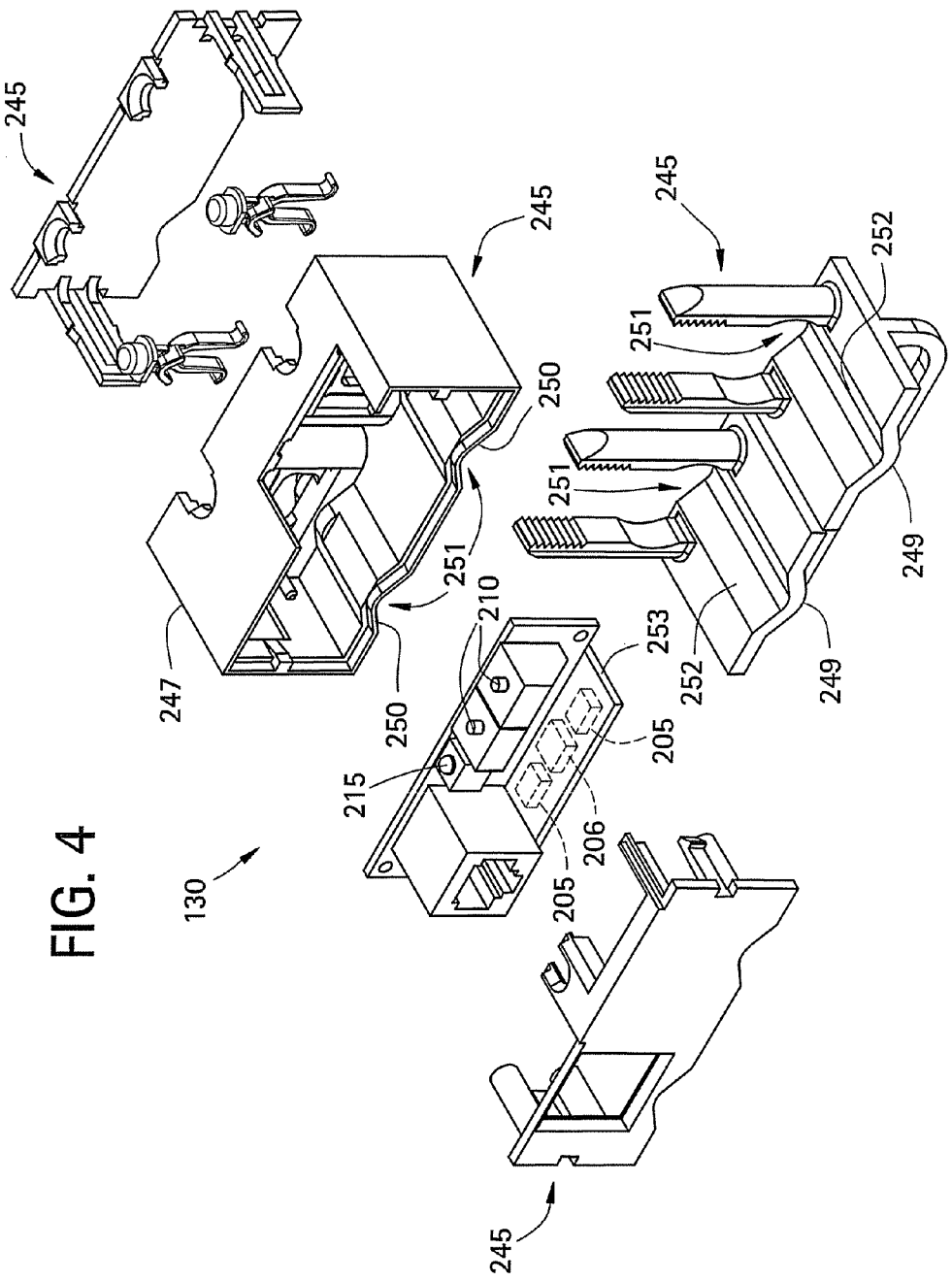
FIG. 4 depicts an exploded view of the current sensing module of FIG. 3 in accordance with an embodiment of the invention.

FIG. 4 depicts an exploded view of the CSM 130. The CSM 130 includes a housing 245 including a first section 247 and a second section 249 (also herein referred to as a clamp). A printed circuit board 253 that includes the current sensors 205, such as MEMS-based current sensors 205 and the appropriate interface electronics 206, is disposed in the first section 247. The interface electronics 206 are configured to amplify, sample, and process a sensed, or measured current, and communicate with hub 120 a signal representative of information associated with power consumption. Together, the first section 247 and the clamp 249 have a translational degree of freedom therebetween. A surface 250 of the first section 247 and a surface 252 of the clamp 249 define an opening 251 for receiving the conductors 112, 113 therethrough. The MEMS-based current sensors 205 are disposed proximate the surface 250 of the opening 251.

The clamp 249 is in operable connection with the first section 247 to translate relative thereto, thereby providing adjustment of a dimension 255 (best seen with reference to FIG. 6) of the opening 251 for securing the housing 245 to the conductors 112, 113. Additionally, the clamp 249 is separable from the first section 247, thereby allowing retrofit installation of the CSM 130 as described above. In an embodiment, the MEMS sensors 205 and printed circuit board 253 are assembled within the first section 247 as an integrated unit of the CSM 130. A plurality of openings 251 are defined by a plurality of surfaces 252 of individual clamps 249 in conjunction with individual surfaces 250 of the first section 247. In an embodiment the individual surfaces 250 include individual geometric features, such as inclined planes for example. Use of the plurality of individual, independently adjustable clamps 249 that correspond to each conductor 112, 113 of a plurality of conductors 112, 113 allows adjustment for and accommodation of different diameter conductors 112, 113 in connection with current protection devices 114 disposed adjacent to the CSM 130

Figure 5:
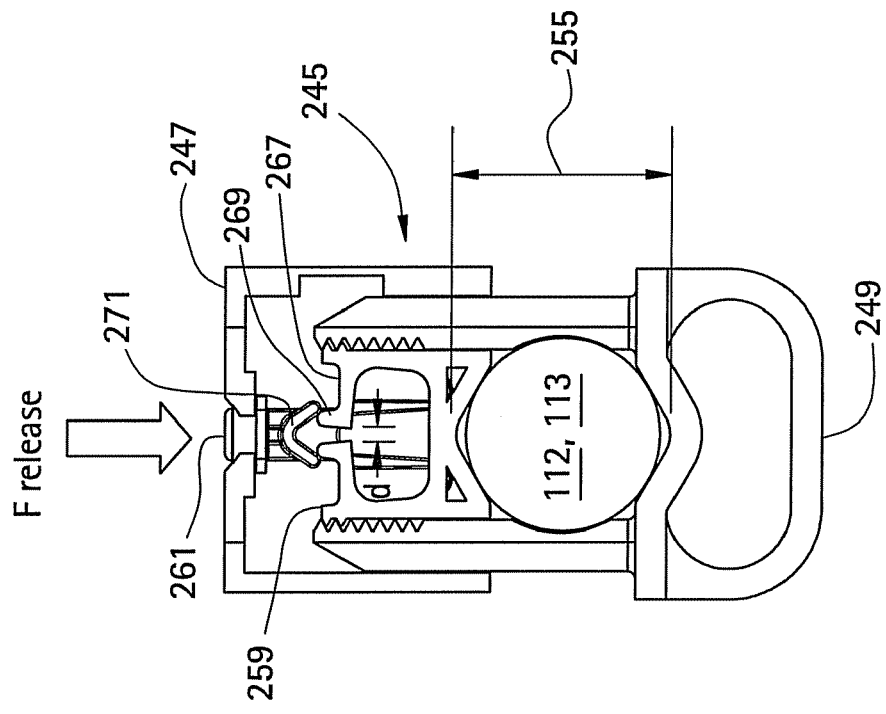
FIGS. 5 and 6 depict cut away views of a current sensing module in accordance with an embodiment of the invention.
Figure 6:
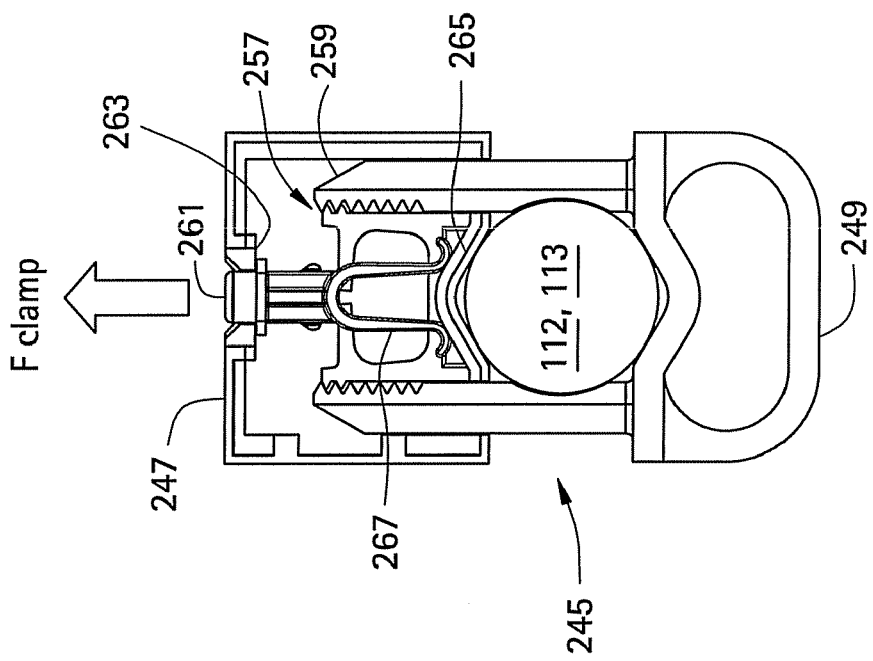

FIGS. 5 and 6 respectively depict a front and rear cut away view of an exemplary embodiment of the housing 245. FIG. 5 depicts interaction of the first section 247 and the clamp 249 for the clamping the conductors 112, 113. The clamp 249 is inserted into the first section 247 in a direction depicted as F clamp to surround or clamp the conductors 112, 113 as shown. The first section 247 and the clamp 249 each include a series of mating engagement features 257, such as serrated teeth molded into arms of the clamp 249, which enable adjustment of the dimension 255 of the opening 251 to accommodate clamping of a range of sizes of conductors 112, 113. The serrated teeth 257 also allow retention of the adjusted dimension 255, to secure the housing 245 to the conductors 112, 113. The serrated teeth 257 of the first section 247 are disposed on two opposing cantilevered snap arms 259. The serrated teeth 257 of the snap arms 259 and the clamp 249 interlock, to thereby lock the clamp 249 in position relative to the first section 247, thereby surrounding the diameter of the conductors 112, 113.

Captured within the first section 247 is a push button or release 261 to disengage the serrated teeth 257, as will be described further below. The push button 261 is captured between a button seat 263 and inclined planes 250 of the first section 247. The push button 261 has two spring arms 267 that interface with the inclined planes 250 to exert a force and bias the push button 261 in the direction of F clamp, which allows free motion of the snap arms 259 as the clamp 249 is being inserted into the first section 247.

FIG. 6 is a cut away from the opposite side showing components used to release the clamp 249 from the first section 247. Integrated with each snap arm 259 is a beam 267 with a cam bulb 269. A clearance distance (d) allows the snap arms 259 to flex freely. In response to application of a force to the push button 261 in the direction of F release, a push button cam follower 271 interfaces with the cam bulbs 269 thereby deflecting the snap arms 259 and diminishing or reducing clearance distance (d) to disengage the serrated teeth 257 and allow the clamp 249 to be freely removed from the first section 247.

Referring now to FIGS. 7 and 8, cut-away views of an exemplary embodiment of the CSM 130 is depicted. A lead screw 273 is disposed and retained within the first section 247, and has a rotational degree of freedom Z relative to the first section 247. A thread 274 of the lead screw 273 passes through a crossbar 275 disposed within the first section 247. The crossbar 275 has a translational degree of freedom within the first section 247 (in a direction X) relative to the surface 250, and is in operable communication with the lead screw 273 such that the crossbar 275 is responsive to rotation of the lead screw 273 (in direction Z) to translate in the direction X. The clamp 249 is in separable connection with the crossbar 275 within the first section 247. The clamp 249 is attached to the crossbar 275 via a fastener 277, such as a screw, a rivet, a snap, or other mechanical means. Therefore, rotation of the leadscrew 273 provides translation of the crossbar 275, which results in translation of the attached clamp 249, thereby allowing adjustment of the dimension 255 of the opening 251 to receive and clamp a wide range of diameters of the conductors 112, 113.

FIG. 9 shows a cut away view of the CSM 130 clamped upon the conductor 112, 113. The MEMS current sensor 205 is disposed upon the printed circuit board 253 proximate a portion less than 100% of the circumference of the conductor 112, 113, as described above. With reference to FIGS. 4, 5, and 9, it will be appreciated that the dimension 255 of the opening 251, in conjunction with the diameter of the conductor 112, 113, defines a minimum distance or gap 279 between the current sensor 205 and the conductor 112, 113. Configuration of the clamp 249 such that it includes a length 281, provides support the conductor 112, 113 in the length 281 that is proximate the current sensor 205, and thereby helps to minimize the gap 279 between the conductor 112, 113 and the sensor 205.

Figure 10:
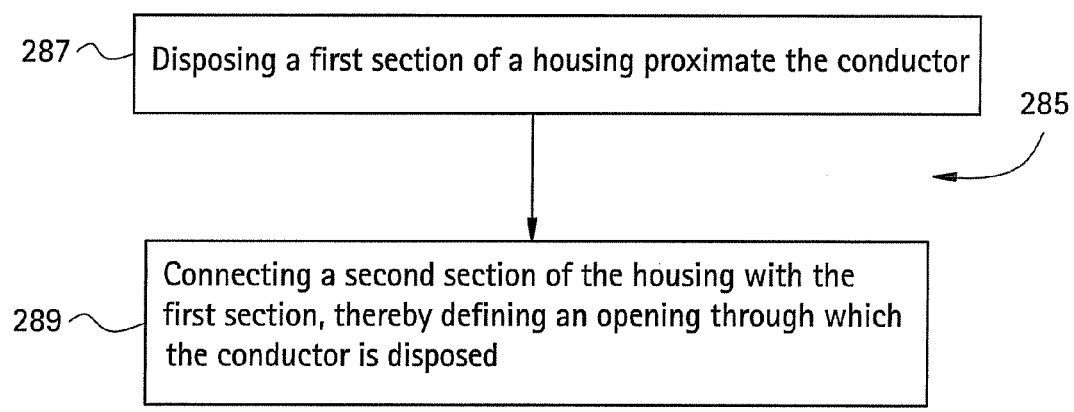
FIG. 10 depicts a flow chart of process steps for disposing a current sensing module proximate a conductor in accordance with an embodiment of the invention.

In view of the foregoing, the CSM 130 facilitates a method of retrofit assembly onto a conductor, such as the conductors 112, 113 that may be installed within a current protection device 114, such as at least one of the circuit breaker and fusible switch, without a need for removal of the conductors 112, 113 from the device 114. Referring now to FIG. 10 in conjunction with FIGS. 4 through 8, a flow chart 285 of process steps for disposing the current sensing module 130 proximate the conductors 112, 113 is depicted.

The process begins at Step 287 with disposing the first section 247 of the housing 245 proximate the conductors 112, 113, the first section 247 including the MEMS-based current sensor 205. The process concludes at Step 289 with connecting the clamp 249 of the housing 245 with the first section 247, thereby defining the opening 251 through which the conductors 112, 113 is disposed.

In an embodiment, the process further includes translating the clamp 249 relative to the first section 247, thereby adjusting the dimension 255 of the opening 251 and securing the housing 245 to the conductors 112, 113.

In one embodiment, translating the clamp 249 includes engaging the mating engagement features 257 of the first section 247 and the clamp 249 to retain the dimension 255 of the opening 251. In another embodiment, connecting, at Step 289, the clamp 249 with the first section 247 includes connecting the clamp 249, within the first section 247, to the crossbar 275 disposed within the first section 247. The crossbar 275 has the translational degree of freedom (in the direction X) within the first section 247 relative to the surface 250 defining the opening 251, and is in operable connection with the leadscrew 273 disposed and retained within the first section 247. Accordingly, translating the surface 252 of the clamp 249 relative to the surface 250 includes rotating the leadscrew 273 in the rotational degree of freedom (in the direction Z) such that in response to rotating the leadscrew 273, the thread 274 of the leadscrew 273 causes the crossbar 275 and the surface 252 of the connected clamp 249 to translate relative to the surface 250, of the first section 247, thereby adjusting the dimension 255 of the opening 251.

In an embodiment, the information associated with power consumption, including signals representative of the measured current flows, are to be transmitted via wired communications from the CSM 130 to the hub 120. In an embodiment, multiple CSMs 130 are linked together, in series, to the hub 120 by a connection arrangement referred to as a daisy-chain connection. In an embodiment, each of the plurality 131 of CSMs 130 further comprises an address switch 210 for identifying the CSM 130 associated with the information associated with power consumption of the respective circuit 110 through which the measured current flows. In an embodiment, the CSM 130 shall have a LED 215, to indicate operation status of the CSM 130, and a cable port 230 for interconnection with other CSMs 130 and the hub 120. In an embodiment, the CSM 130 includes more than one cable port 230. In an embodiment, the address switch 210 allows an installer of the CSM 130 to set, or define, the address of each CSM 130 to identify the current measurements that relate to each circuit, and ultimately, each sub-metered suite. In an embodiment, the address of the CSM 130, which correlates the sub-metered circuit 110 to the sub-metered suite, is set by the installer and transmitted with the signals representative of the measured current flow.

While an embodiment of the invention has been described and depicted having an address switch, it will be appreciated that the scope of the invention is not so limited, and that the invention will also apply to other means to identify the circuit through which the measured current flows, such as a dial, a pre-assigned serial number associated with the CSM, and a software-assigned identifier, such as an IP address that may be provided by one of the hub and the data collector, for example.

Figure 11:
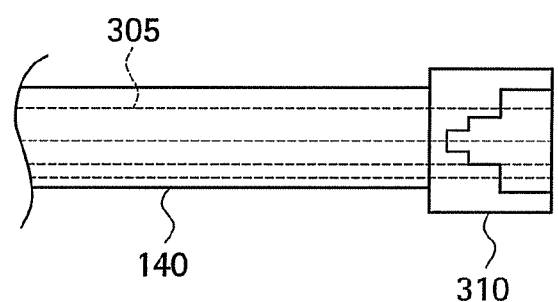
FIG. 11 depicts a schematic representation of an exemplary communication link in accordance with an embodiment of the invention.

In an embodiment, the plurality 131 of the CSMs 130 is in signal communication with the hub 120 via the single communication link 140. Referring now to FIG. 11, an exemplary embodiment of the single communication link 140 is depicted. In an embodiment, the single communication link 140 has a plurality of communication paths 305, or conductors. In an embodiment, the single communication link 140 is a wire that comprises a single connector 310 at each end thereof configured to connect the plurality of communication paths 305 to the hub 120 at one end of the link 140 and the CSM 130 at the other end of the link 140. In an embodiment, the single connector 310 is an RJ45 type of connector that is often used to provide computer-networking connections. Use of the single connector 310 allows for simple and time efficient connections between the plurality 131 of CSMs 130 and the hub 120.

While an embodiment of the invention has been described having an RJ45 connector, it will be appreciated that the scope of the invention is not so limited, and that the invention will also apply to electrical sub-metering systems having any other variety of multi-conductor connectors, such as RJ25 connectors, DE9 connectors, and Universal Serial Bus (USB) connectors, for example, to allow simple and time efficient connection between the CSMs and the hub.

In an embodiment, each CSM 130 of the plurality 131 of CSMs 130 are associated with a respective one circuit 110 of the plurality 111 of circuits. In an embodiment, the single communication link 140 is configured to provide to the hub 120 the information associated with the power consumption calculation for the plurality 131 of the CSMs 130. In an embodiment, the information associated with the power consumption calculation is identified by circuit 110 via the address switch 210. In an embodiment, each CSM 130 of the plurality 131 is in signal communication with at least one other CSM 130 of the plurality 131 of CSMs 130.

While an embodiment of the invention has been depicted with the plurality of CSMs in signal communication with the hub via a single communication link, it will be appreciated that the scope of the invention is not so limited, and that the invention will also apply to electrical sub-metering systems having other communication link arrangements, such as two, three, four, or more, sets of CSMs, with each set in signal communication with the hub via the single communication link, and each CSM of each set in signal communication with at least one other CSM, for example.

In another embodiment, the CSM 130 includes a wireless communication device 240, and the hub 120 includes a wireless communication device 122. In an embodiment, the hub 120 is in signal communication with the CSM 130 via a wireless connection provided by the wireless communication devices 240, 122.

In an embodiment, the voltage is measured across a set of bus bars of the power feed 105 in the panel 115, and referenced to neutral via the voltage sensor 123. In an embodiment, the current and voltage measurements are synchronized via a communication protocol or synchronization pulse. The measured current and voltage of the circuit 110 is used to perform the energy and power consumption calculations corresponding to the circuit 110. In an embodiment, the hub 120 may also include a display screen 121, to allow the user to view one of stored and real-time data, per suite. In another embodiment, the display screen 121 of the hub 120 may be used to display and define the addresses of the CSMs 130. In an embodiment, the hub 120 is disposed within the panel 115. In another embodiment, the hub 120 is attached to the panel 115.

In an embodiment, one of the energy consumption calculation and the power consumption calculation is transmitted from the hub 120 to the data collector 150. In an embodiment, the data collector 150 is configured to utilize the transmitted consumption calculations to determine the energy bill per suite. In an embodiment, billing-tracking software correlates each power consumption value with the particular suite, at particular rates, which may be set by the utility, building owner, or billing company. In an embodiment, this billing information can be transmitted via one of wired and wireless communication to the building owner, or billing company. In an embodiment, the data collector can also operate as a part of a Supervisory Control And Data Acquisition (SCADA) system, configured to monitor and control a variety of functions of a manufacturing site, for example.

Figure 12:
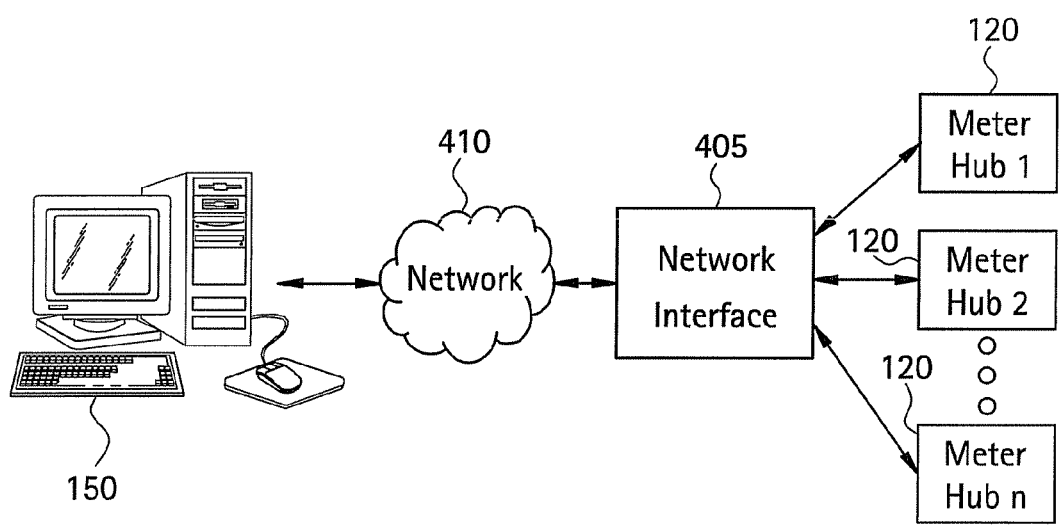
FIG. 12 depicts a pictorial schematic representation of a connection between a plurality of hubs and a data collector in accordance with an embodiment of the invention.

Referring now to FIG. 12, an exemplary embodiment of the connection between a plurality of hubs 120 and the data collector 150 is depicted. The connection between the hubs 120 and the data collector 150 is provided by a network connection 410 via a network interface 405, as depicted. In an embodiment, the data collector 150 is in signal communication with the hub 120 via the following types of network connection 410: an Ethernet connection; a direct serial connection; a dial-up connection; and, a power line connection. In an embodiment, the Ethernet connection 410 includes one of an Internet connection, an Intranet connection, an Extranet connection, and a dial-up connection. In an embodiment, the Ethernet connection includes one of a wired Ethernet connection and a wireless Ethernet connection. In an embodiment that provides a wireless Ethernet connection 410, the network interface 405 includes an Ethernet wireless router. In an embodiment that provides a wired Ethernet connection 410, the network interface 405 comprises one of an Ethernet Hub, an Ethernet Switch, and an Ethernet Router. In an embodiment that provides a direct serial connection 410, the network interface 405 comprises a RS485/RS232 Converter. In an embodiment that provides a power line connection 410, network interface 405 includes at least one Ethernet to power line carrier bridge. In an embodiment that provides a dial-up connection 405, the network interface 405 includes a dial up to Ethernet gateway modem.

In view of the foregoing, embodiments of the sub-metering system 100 are configured as follows.

In an embodiment, the hub 120 is configured to provide to the CSM 130 the information associated with power consumption, including a signal representative of voltage of the circuit 110 corresponding with the measured current flow. The CSM 130 further includes means, such as processing circuitry included with the interface electronics 206 for example, for performing the power consumption calculation using the information associated with power consumption provided by the hub 120, and is configured to provide to the hub 120 the power consumption calculation. In an embodiment, the hub 120 is configured to provide to the CSM 130 a scaled voltage signal including a plurality of phases, such as a scaled three-phase voltage, for example, and the interface electronics 206 of the CSM 130 are configured to capture the scaled plurality of phases voltage signal. In another embodiment, the hub 120 is configured to synchronize sampling of current and voltage of each of the plurality 111 of circuits 110, and to capture and provide to the CSM 130, samples of the voltage of the circuit 110 corresponding with the measured current. In another embodiment, the hub 120 is configured to synchronize sampling of current and voltage of each of the plurality 111 of circuits 110. The hub 120 is also configured to capture and transform samples of the voltage of the circuit 110 corresponding with the current measurement into a signal comprising voltage magnitude and phase, and to provide to the CSM 130 the signal comprising voltage magnitude and phase.

While an embodiment of the invention has been described having a voltage signal including a plurality of phases, such as three phases, it will be appreciated that the scope of the invention is not so limited, and that the invention will also apply to other sub-metering systems that may have other numbers of phases in a polyphase system, such as two, four, five, six, or more phases, as well as single phase systems, for example.

In another embodiment, the hub 120 is configured to capture samples of voltage of the circuit 110 corresponding with the measured current. The hub 120 is also configured to synchronize sampling of current and voltage of each of the plurality 111 of circuits 110, and to request from the CSM 130 samples of the measured current corresponding with the captured samples of voltage. The CSM 130 is configured to be responsive to the request from the hub 120, and to make available to the hub 120 the samples of the measured current corresponding with the captured samples of voltage, and the hub 120 is configured to perform the power consumption calculation of the circuit 110. In an embodiment, the hub 120 is configured to transform the captured samples of voltage of the circuit 110 into a signal comprising voltage magnitude and phase. The processing circuitry of the interface electronics 206 of the CSM 130 is configured to be responsive to the request from the hub 120, and productive of a signal representative of current magnitude and phase corresponding with the transformed samples of voltage.

As disclosed, some embodiments of the invention may include some of the following advantages: the ability to reduce overall sub-metering panel dimensions as a result of the use of MEMS-based current sensors; the ability to increase sub-metering power calculation accuracy; the ability to increase installation ease of sub-metering functionality in existing systems lacking such functionality; and the ability to reduce electrical panel ventilation requirements as a result of reduced heat generation by MEMS-based current sensors.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A current sensing module for disposal proximate a conductor, the current sensing module comprising:
a housing comprising a first section and a second section that together define an opening for receiving the conductor therethrough, the second section in operable connection with the first section; and
a micro-electromechanical system (MEMS) based current sensor disposed within the first section proximate the opening for receiving the conductor;
wherein the first section and the second section each comprise mating engagement features that enable adjustment and retention of the dimension of the opening.

2. The current sensing module of claim 1, wherein the second section is in separable connection with the first section.

3. The current sensing module of claim 1, wherein the first and second sections have a translational degree of freedom therebetween, and translation of the second section relative to the first section adjusts a dimension of the opening for securing the housing to the conductor.

4. The current sensing module of claim 1, wherein the mating engagement features comprise serrated teeth.

5. The current sensing module of claim 1, further comprising a release to enable disengagement of the mating engagement features.

6. The current sensing module of claim 3, further comprising:

a lead screw disposed and retained within the first section, the lead screw having a rotational degree of freedom relative to the first section; and a crossbar disposed within the first section, the crossbar in operable communication with the lead screw, the crossbar having a translational degree of freedom relative to a surface of the first section that defines the opening and responsive to rotation of the lead screw;

wherein the second section is in separable connection with the crossbar within the first section.

7. The current sensing module of claim 3, wherein the opening defines a minimum distance from the MEMS-based current sensor to the conductor.

8. The current sensing module of claim 1, wherein the MEMS-based current sensor is disposed proximate the opening for receiving the conductor absent complete enclosure of the conductor.

9. The current sensing module of claim 1, wherein the conductor is in power connection with a current protection device.

10. The current sensing module of claim 9, wherein the housing is disposed proximate the current protection device.

11. The current sensing module of claim 9, wherein:

the conductor is one of a plurality of conductors;

the first section of the housing comprises a plurality of geometric features corresponding to each conductor of the plurality of conductors;

the second section of the housing is one of a plurality of second sections, each second section of the plurality corresponding to each conductor of the plurality of conductors; and the plurality of geometric features and the plurality of second sections together define a plurality of openings for disposing the plurality of conductors therethrough.

12. The current sensing module of claim 11, wherein:

the plurality of geometric features and each second section of the plurality of second sections have a translational degree of freedom therebetween; and translation of a second section of the plurality of second sections relative to one of the plurality of geometric features adjusts a dimension of a corresponding opening of the plurality of openings.

13. A method of disposing a current sensing module proximate a conductor, the method comprising:

disposing a first section of a housing proximate the conductor, the first section comprising a micro-electromechanical system (MEMS)-based current sensor;

connecting a second section of the housing with the first section, thereby defining an opening for receiving the conductor therethrough; and translating the second section relative to the first section, thereby adjusting a dimension of the opening and securing the housing to the conductor.

14. The method of claim 13, wherein the translating comprises engaging mating engagement features of the first and second section to retain the dimension of the opening.

15. The method of claim 13, wherein:

the connecting comprises connecting the second section to a crossbar disposed within the first section, the crossbar having a translational degree of freedom relative to a surface of the first section that defines the opening and in operable connection to a leadscrew disposed and retained within the first section, the leadscrew having a rotational degree of freedom relative to the first section; and the translating comprises translating the crossbar and the connected second section in response to rotating the lead screw.

16. The method of claim 13, wherein the disposing comprises disposing the MEMS-based current sensor proximate the conductor absent complete enclosure of the conductor by the MEMS-based current sensor.

17. The method of claim 13, wherein the disposing comprises disposing a first section of a housing proximate a conductor in power connection with a current protection device.

18. The method of claim 17, wherein the disposing comprises disposing the first section of a housing proximate the current protection device.

* * * * *